United States Patent [19]

Itozaki et al.

[11] Patent Number: 5,225,397
[45] Date of Patent: Jul. 6, 1993

[54] METHOD FOR PREPARING SUPERCONDUCTING THIN FILM

[75] Inventors: Hideo Itozaki; Saburo Tanaka; Kenjiro Higaki; Hisao Hattori; Naoji Fujimori; Shuji Yazu; Tetsuji Jodai, all of Itami, Japan

[73] Assignee: Sumitomo Electric Industries, Ltd., Osaka, Japan

[21] Appl. No.: 806,822

[22] Filed: Dec. 6, 1991

Related U.S. Application Data

[63] Continuation of Ser. No. 314,983, Feb. 24, 1989, abandoned.

[30] Foreign Application Priority Data

Feb. 25, 1988 [JP] Japan .................................. 63-42691

[51] Int. Cl.$^5$ .............................................. C23C 14/34
[52] U.S. Cl. .................... 505/1; 204/192.24; 505/731; 505/816
[58] Field of Search .................. 204/192.24; 505/730, 505/731, 733, 783, 816, 819

[56] References Cited

U.S. PATENT DOCUMENTS

| | | | |
|---|---|---|---|
| 4,870,052 | 9/1989 | Engler et al. | 505/1 |
| 4,962,083 | 10/1990 | Hermann et al. | 505/1 |
| 4,994,432 | 2/1991 | Hermann et al. | 505/783 X |

OTHER PUBLICATIONS

M. Tonouchi et al., "High Tc . . . Films", Jap. Journal of Appl. Physics vol. 26, No. 9, Sep., 1987, pp. 1462-1464.

O. Michikami et al., "Synthesis . . . Sputtering", Jap. Journal of Appl. Physics, vol. 26, No. 7, Jul., 1987, pp. 1199-1201.

T. Aida et al., "Preparation . . . Sputtering", Jap. Journal of Appl. Physics, vol. 26, No. 9, Sep., 1987, pp. 1489-1491.

*Primary Examiner*—Nam X. Nguyen
*Attorney, Agent, or Firm*—Jordan B. Bierman

[57] ABSTRACT

A superconducting material composed mainly of compound oxide having a composition represented by the general formula:

$$Tl_xCa_yBaCu_zO_p$$

in which "x", "y" and "z" are numbers each satisfies $0.5 \leq x \leq 3.0$, $0.5 \leq y \leq 3.0$, and $0.9 \leq z \leq 4.0$ respectively.

4 Claims, No Drawings

METHOD FOR PREPARING SUPERCONDUCTING THIN FILM

This application is a continuation of application Ser. No. 07/314,983, filed Feb. 24, 1989, now abandoned.

BACKGROUND OF THE INVENTION

1. Field of the Invention

The present invention relates to superconducting material and a method for preparing the same. More particularly, it relates to a novel superconductor which exhibits superconducting property at a very high temperature and a method for preparing the same.

2. Description of the related art

Certain kinds of materials exhibit the perfect diamagnetism under the phenomenon of superconductivity and no electrical resistance is observed even if a definite constant current flows therethrough.

Such phenomenon of superconductivity is applicable to various industrial fields. For example, in the field of power electric, MHD power generation, power transmission, electric power reservation or the like are expected. In the field of transportation, magnetic levitation trains, magnetically propelling ships or the like are expected. In the field of measurement, high sensitive sensors or detectors for sensing a very weak magnetic field, microwave, radiant ray or the like are expected. In the medical field, high-energy beam radiation units or the like are expected. In the field of science, NMR, high-energy beam radiation units or the like are expected. In addition to the abovementioned power electric applications, the superconducting materials are expected in the field of electronics. For example, a Josephson device which is an indispensable switching device for realizing a high-speed computer which consumes very reduced power is expected to be realized.

However, their actual usage have been restricted because the phenomenon of superconductivity was observed only at very low cryogenic temperatures. Among known superconducting materials, a group of materials having so-called A-15 structure show rather higher Tc (critical temperature of superconductivity) than others, but even the top record of Tc in the case of $Nb_3Ge$ which showed the highest Tc could not exceed 23.2K at most. This means that liquidized helium (boiling point of 4.2 K.) is only one cryogen which can realize such very low temperature of Tc. However, helium is not only a limited costly resource but also require a large-scaled system for liquefaction. Therefore, there had been a strong demand for another superconducting material having higher Tc.

The possibility of an existence of new types of superconducting materials having much higher Tc was revealed by Bednorz and Müller, who discovered a new oxide type superconductor in 1986 [Z. Phys. B64 (1986) 189]

The new type compound oxide superconductor discovered by Bednorz and Müller is represented by [La, Sr]$_2$CuO$_4$ which is called the $K_2NiF_4$-type oxide having a crystal structure which is similar to known perovskite type oxides. The $K_2NiF_4$-type compound oxides show such higher Tc as 30 K. which are extremely higher than known superconducting materials.

It was also reported that C. W. Chu et al. discovered, in the United States of America, another superconducting material so called YBCO type represented by $YBa_2Cu_3O_{7-x}$ having the critical temperature of about 90 K in February 1987 (Physical Review Letter (58) 908–910).

The discovery of such high-temperature superconductors is expected to accelerate the utilization of superconducting technology. In fact, in the case of the above-mentioned new type superconductors, the superconductivity can be realized in liquidized nitrogen, as a cryogen, which is cheaply available on market and hence the cost performance of the superconducting technology can be improved.

However, it is still requested to elevate the practical critical temperature in order that the superconductor can be used in a stable and confidential condition. In other words, it is desirable to increase the discrepancy between the critical temperature Tc of a superconductor and the cryogen temperature (particularly a boiling temperature of the cryogen).

An object of the present invention is to provide a novel superconducting material which exhibit the superconducting property at a higher temperature and which can lighten a burden on the liquefaction system of cryogen, and a process for producing the same.

SUMMARY OF THE INVENTION

A novel superconducting material provided by the present invention is characterized in that the superconducting material is composed mainly of compound oxide having a composition represented by the general formula:

$$Tl_xCa_yBaCu_zO_p$$

in which "x", "y" and "z" are numbers each satisfies $0.5 \leq x \leq 3.0$, $0.5 \leq y \leq 3.0$, and $0.9 \leq z \leq 4.0$ respectively and p is 3.15 to 12.5.

The superconducting material composed mainly of the compound oxide represented by the above-mentioned general formula can be obtained in a form of a sintered article or in a form of a thin film.

It should be understood that the proportions of the constituent elements of the superconducting material are not strictly limited to the above-mentioned ranges. In fact, there is such a case that a compound oxide whose proportion is deviated by ±50%, preferably ±20% from the above-mentioned range shows an effective superconducting property. Therefore, the term "composed mainly of" means that the other compound oxides whose proportions are deviated from the above-mentioned range also fall in the scope of the present invention. For example, the superconducting materials according to the present invention may contain the other elements which will be contained inevitably as contaminants in the order of ppm or which are added intentionally in order to improve the other properties of the sintered mass or thin film obtained in addition to the constituent elements defined in the general formula. As the elements which can be added intentionally, it can be mentioned elements of IIa group or IIIa group of the periodic table.

As is described hereafter in more details, the superconducting material according to the present invention possess a very superior superconducting property and is improved in stability, so that the effective superconducting property is maintained for a long time in air.

The present invention provides also a process for preparing the above-mentioned novel superconducting material.

DETAILED DESCRIPTION OF THE INVENTION

The process for preparing a superconducting material composed mainly of compound oxide having a composition represented by the general formula:

$$Tl_xCa_yBaCu_zO_p$$

in which "x", "y" and "z" are numbers each satisfies $0.5 \leq x \leq 3.0$, $0.5 \leq y \leq 3.0$, and $0.9 \leq z \leq 4.0$ respectively, and P is 3.15 to 12.5 is characterized by including at least one sintering stage of a material powder selected from a group comprising a power mixture consisting of elemental Tl, Ca, Ba, Cu and/or a compound or compounds each containing at least one element of Tl, Ca, Ba and Cu and a preliminary sintered powder which is obtained by sintering preliminarily said powder mixture and then by pulverizing the resulting preliminarily sintered mass.

The sintering stage is preferably carried out after the material powder is shaped into a compact.

The compounds which contain at least one of Tl, Ca, Ba and Cu is preferably selected from a group comprising respective oxides, carbonates, sulfates, nitrates and oxalates of Tl, Ca, Ba and Cu. The oxides are preferably selected in order to obtain a product of high quality, while the carbonates are preferably selected in order to facilitate preparation of the material powder.

When the carbonates, sulfates, nitrates and oxalates of Tl, Ca, Ba and Cu are used as components of the material powder, it is preferable to sinter or burn preliminarily the material powder before the final sintering stage in order to remove contaminants such as carbon, sulphur, nitrogen or the like. The quality of the product is improved by such preliminary sintering operation. Therefore, according to a preferred embodiment, a mixture of carbonates of Ca and Ba and oxides Cu and Tl are burnt or preliminarily sintered and the resulting preliminarily sintered mass is pulverized to obtain the material powder.

In order to obtain a sintered mass which possesses a superior superconducting property, it is indispensable to control the following factors: (i) particle size of the material powder, (ii) temperature during the preliminary sintering operation, (iii) particle size of the preliminary sintered and pulverized powder, and (iv) temperature during the final sintering stage.

In fact, if an average particle size of the material powder exceed 10 $\mu m$, fine uniform grains can not be obtained easily even after such material powder is subjected to the preliminary sintering operation. Therefore, the average particle size of the material powder is preferably less than 10 $\mu m$, more preferably in a range of 1 to 5 $\mu m$. Remarkable advantage of the pulverization is obtained when the average particle size is reduced below 5 $\mu m$. It should be note that the grain size of the product is directly influenced by the average particle size of the material powder which will be subjected to the final sintering. Therefore, a series of operations of preliminary sintering, pulverization and compacting is preferably repeated for several times, for example more than 2 times, in order to homogenize the material powder and hence to improve the quality of the product.

The preliminary sintering and/or the final sintering is preferably carried out at a temperature which is higher than 750° C. but is not higher than a melting point of the material powder, more preferably between 800° and 900° C.

The final sintering temperature is one of the critical factors in the process for producing the superconducting compound oxide, so that the final sintering temperature is controlled and adjusted to a temperature at which the sintering proceed in a solid reaction without substantial fusion of the material powder and excessive crystal growth is not occur in the resulting sintered compound oxide. Therefore, the final sintering temperature should not exceed the melting point of the composed material powder mixture. To the contrary, satisfactory sintering can not be effected if the final sintering temperature is too low. Therefore the final sintering must be carried out a temperature which is higher than 750° C. Although longer sintering time is preferable, duration of the final sintering operation is generally for 1 hour to 50 hours in actual practice, in other words, it is preferable to maintain this sintering temperature for 1 to 50 hours.

The above-mentioned preliminary sintering operation should be also controlled precisely in the same manner as above. Namely, satisfactory preliminary sintering reaction can not be effected and hence a desired composition can not be obtained at temperatures which is lower than 800° C. The preliminary sintering temperature should not exceed the melting point of the material powder because of the same reason as above.

The superconducting material according to the present invention can be formed into a thin film by the conventional physical vapor deposition (PVD) technique by using the sintered mass or powder obtained as a target or a vapour source, so that the target or a vapour source evaporates in a vacuum chamber to produce a thin film deposited on a substrate.

The proportions or atomic ratios of the elements in the vapor source are selected in such a manner that the desired atomic ratios of the elements are realized in the deposited thin film in consideration of vaporization rate or sputtering rate or the like. As the physical vapor deposition (PVD), techniques of vacuum deposition, sputtering, ion-plating or molecular beam epitaxial (MBE) growth are used preferably.

The substrate on which the thin film is deposited is preferably selected among those that have a similar crystal structure or lattice constants such as MgO, $SrTiO_3$, $BaTiO_3$, $SiO_2$, $LaGaO_3$, $LaAlO_3$, sapphire or YSZ.

The vapor source may be any one of (i) a powder mixture consisting of constituent elements of which the superconducting material is composed and/or compounds of the elements, (ii) a preliminary sintered block which is prepared by sintering preliminarily such powder mixture, (iii) a preliminarily sintered powder which is obtained by pulverizing the preliminary sintered block, (vi) a finally sintered block which is obtained by sintering the preliminary sintered powder, or (v) a finally sintered powder which is obtained by pulverizing the finally sintered block.

As stated above, the proportions or atomic ratios of the elements in the vapor source and/or the partial oxygen pressure are preferably adjusted in such a manner that the desired atomic ratios of the elements are realized in the deposited thin film of compound oxide in the function of vaporization rate or sputtering rate of the elements.

It is also preferable to anneal the deposited thin film in the atmosphere containing thallium vapour and oxygen gas in order to improve and stabilize the superconducting property of the film.

The novel superconducting materials of compound oxide containing a plurality of metal elements according to the present invention is a superconductor which has a remarkably higher critical temperature and which has much lasting stability than the known superconductors. Therefore, the superconductivity can be realized in relatively cheaper cryogen by a smaller liquefaction system.

The superconducting materials according to the present invention can be obtained in a form of a plate, a fine wire or a small parts and can be obtained in a form of a thin film which can be utilized advantageously in applications of MAtisoo switching elements, Josephson device, a variety of sensors of Superconducting Quantum Interference Device (SQUID) or the like.

Now, the present invention will be described by Examples, but the scope of the present invention should not be limited thereto.

EXAMPLE 1

Commercially available $Ba_2O_3$ powder, $CaCO_3$ powder and CuO powder were mixed in a ball mill. The resulting powder mixture is sintered preliminarily at 925° C. for 30 minutes to obtain a preliminarily sintered mass.

After the preliminarily sintered mass was pulverized in a ball mill below 10 μm, $Tl_2O_3$, powder was further added and then pulverized below 5 μm to prepare a material powder. The proportions of the above-mentioned powders had been adjusted in such a manner that the atomic ratios of Tl:Ca:Ba:Cu in the material powder became to 2:2:1:3.

The material powder was compacted by a press and then sintered finally at 900° C. for 1 hour.

The measurement of the critical temperature on a sample obtained revealed that resistance dropped sharply at 110 K. and the resistance could not be detected at 85 K.

After electrodec were connected to opposite ends of the sample with silver paste, the critical temperature was determined in a cryostat by the conventional four probe method. Temperature was measured by a calibrated Au(Fe)-chromel thermocouple.

The sample was left in air for 20 days and the same measurement was repeated, but no significant difference was observed.

The sample was analyzed by a combination of ICP (inductive coupled plasma) spectrochemical analyzer and the measurement of weight change to determine the composition of the sample. From the result of analysis, the composition of the sample was determined as follow:

$Tl_2Ca_2BaCu_3O_p$ in which "p" was about 9.5.

EXAMPLE 2

Two samples were prepared. At first, $Ba_2O_3$ powder (4N) and CuO powder (4N) were mixed in a ball mill in such atomic ratios of Ba:Cu as are shown in Table 1.. The resulting powder mixtures were sintered preliminarily at 900° C. for 8 hours to obtain respective preliminarily sintered mass of Ba-Cu-O.

After the respective preliminarily sintered mass was pulverized in a ball mill below 10 μm, $Ta_2O_3$ powder (4N) and CaO powder (4N) were further added to each sample and then pulverized below 5 μm in a glove box to prepare two material powders. The proportions of the powders added were adjusted in such an atomic ratio of Tl:Ca:Ba:Cu in the material powder as is shown in Table 1.

Each material powder was wrapped by a foil made of gold and sintered under the sintering conditions summarized in Table 1.

The critical temperatures determined by the same method as Example 1 are shown in Table 1.

TABLE 1

| Sample No. | Composition of the sintered mass | Sintering conditions | Tc (K) |
|---|---|---|---|
| 1 | $Tl_2Ca_2Ba_2Cu_2O_p$ | 910° C. for 3 hours | 120 |
| 2 | $Tl_1Ca_3Ba_1Cu_3O_p$ | 910° C. for 5 hours | 125 |

EXAMPLE 3

$Ba_2O_3$ powder (4N), $CaCO_3$ powder (4N) and CuO powder (4N) were mixed in a ball mill in such an atomic ratio of Ba:Ca:Cu of 2:2:3. The resulting powder mixture was sintered preliminarily at 900° C. for 8 hours to obtain a preliminarily sintered mass of Ba-Ca-Cu-O.

After the preliminarily sintered mass was pulverized in a ball mill below 10 μm, $Tl_2O_3$ powder (4N) was further added in such an atomic ratio of Tl:Ca:Ba:Cu of 1:2:2:3 in the material powder and mixed uniformly in a glove box to prepare a material powder.

Then, RF sputtering was carried out by using the material powder thus prepared as a powder target, so that a thin film was deposited on a single crystal of MgO under the following sputtering conditions:

| Sputtering gas: | $Ar + O_2(20\%)$ |
|---|---|
| Sputtering gas pressure | $5 \times 10^{-2}$ Torr |
| RF power density | 2.5 W/cm$^2$ |
| Substrate | MgO {100} plane |
| Substrate temperature | 350° C. |

The thin film obtained was $Tl_2Ca_2Ba_2Cu_3O_p$. The composition of the thin film was determined by the same method as Example 1

Then, the thin film obtained was annealed in the atmosphere containing thallium vapour and oxygen gas as 930° C. for 1 hour and then at 850° C. for 3 hour. The resulting annealed thin film showed Tc (zero resistance) of 115 K. and the critical current density of $3.2 \times 10^6$ A/cm$^2$.

We claim:

1. A process for preparing a superconducting thin film on a substrate by sputtering, characterized in that a target for physical vapor deposition is composed mainly of a compound represented by the formula $Tl_xCa_yBaCu_zO_p$ in which "x", "y" and "z" are numbers each satisfies $0.5 \leq x \leq 3.0$, $0.5 \leq y \leq 3.0$, and $0.9 \leq z \leq 4.0$, respectively and p is 3.15 to 12.5 and a resulting thin film is annealed in an atmosphere containing thallium vapor and oxygen.

2. A process set forth in claim 1, characterized in that said target is prepared by sintering a material powder selected from a group comprising a powder mixture consisting of elemental Tl, Ca, Ba, Cu and/or a compound or compounds each containing at least one element of Tl, Ca, Ba and Cu and a preliminary sintered powder which is obtained by sintering said powder mixture to form a preliminarly sintered mass and then by pulverizing said preliminarily sintered mass.

3. A process set forth in claim 2, characterized in that said compound containing at least one element of Tl, Ca, Ba and Cu is selected from a group comprising respective oxides, carbonates, sulfates, nitrates and oxalates of Tl, Ca, Ba and Cu.

4. A process set forth in claim 2, characterized in that the material powder is compacted previously before the sintering operation.

* * * * *